United States Patent [19]

Kikuchi et al.

[11] Patent Number: 4,633,194

[45] Date of Patent: Dec. 30, 1986

[54] DIGITAL FREQUENCY DIVIDER SUITABLE FOR A FREQUENCY SYNTHESIZER

[75] Inventors: Hiroyuki Kikuchi, Tokyo; Atsushi Iwata, Saitama; Takashi Matsuura; Yoshiharu Shigeta, both of Tokyo, all of Japan

[73] Assignees: Nippon Telegraph & Telephone Public Corporation, Japan; Nippon Electric Co., Ltd., Japan

[21] Appl. No.: 277,396

[22] Filed: Jun. 25, 1981

[30] Foreign Application Priority Data

Jul. 7, 1980 [JP] Japan ................................. 55-92933

[51] Int. Cl.$^4$ ........................ H03L 7/18; H03K 21/00
[52] U.S. Cl. .................................... 331/25; 328/155; 377/44; 377/47
[58] Field of Search ......................... 331/1 A, 16, 25; 328/155, 14; 377/44, 47, 110

[56] References Cited

U.S. PATENT DOCUMENTS 4,184,068 1/1980 Washburn ...................... 331/1 A X
4,344,045 8/1982 Das et al. ........................ 331/16 X

*Primary Examiner*—Eugene R. LaRoche
*Assistant Examiner*—Robert J. Pascal
*Attorney, Agent, or Firm*—Laff, Whitesel, Conte & Saret

[57] ABSTRACT

The frequency divider includes a first or prescaling counter which selects between first and second frequency division factors, in response to a first control signal, and then divides an input signal frequency responsive to the first control signal. A second and programmable counter frequency divides the output of the first or prescaling counter by a third frequency-division factor. A third and programmable counter frequency divides the output of the first counter by a fourth frequency-division factor which is smaller than the third frequency-division factor. A switching control circuit then converts the output of the third counter and supplies the converted signal to the first counter, as the first control signal. The digital frequency divider is suitable for use a part of a phase-locked loop frequency synthesizer.

9 Claims, 4 Drawing Figures

DIGITAL FREQUENCY DIVIDER SUITABLE FOR A FREQUENCY SYNTHESIZER

The present invention relates to high-speed digital frequency dividers suitable for a use as a frequency synthesizer, and more particularly to digital frequency dividers which operate at a high speed and with a reduced power-consumption.

BACKGROUND OF INVENTION

The invention uses "pulse swallow" techniques, for minimizing the need for high-speed logic circuitry. The term "pulse swallow" implies that, in a stream of cyclically recurring pulses, pulses are periodically "swallowed" or removed in order to reduce a need for high-speed logic.

Conventional digital frequency dividers of this kind, are disclosed by Nichols et al. in an article entitled "Pulse Swallowing", which was published in the EDN magazine for Oct. 1, 1970, pp. 39–42, and in Motorola Semiconductor Products, Inc., "Phase-Locked Loop Systems Databook", August 1973, pp. 1–17. Usually, these dividers comprise a two-modulus prescaler (or counter), and first and second programmable counters. The two-modulus prescaler selects one of two possible frequency-division factors P and P+1 (where P is an integer) in response to a control signal, thereby frequency dividing an input signal. The first programmable counter frequency divides the output of the prescaler by a factor of N (where N is an integer) to generate a desired frequency-division output. The second programmable counter frequency divides the output of the prescaler by a factor A (where A is an interger) to generate the control signal. This divider is suitable for use in a phase-locked loop (PLL) frequency synthesizer or the like, for example.

In such a digital frequency divider, the control signal for the prescaler must be fed back within a transmission delay time, which is equal to a cycle ($t_c$) of the output pulse of the prescaler. In other words, the time cycle ($t_c$) must be greater than the sum of the set-up time ($t_{ps}$) required for switching the frequency-division factor of the prescaler, plus the propagation time ($t_A$) of the second programmable counter. This time relationship problem can be solved by enlarging either the factor P of the prescaler, or the cycle $t_c$. However, such an enlarged time factor causes a narrowing of the applicable range of the frequency divider. Moreover, this solution can only expand the factor P, and can not reduce the propagation time of the feedback loop.

SUMMARY OF THE INVENTION

An object of the present invention is to provide a high-speed digital frequency divider by reducing the propagation time of the feedback loop.

In keeping with an aspect of the invention, a digital frequency divider comprises first, second and third counters, and a switching control means. The first counter selects one of first and second frequency-division factors, in response to a first control signal, and divides an input signal frequency responsive thereto. The second counter frequency divides the output of the first counter by a third frequency-division factor. The third counter frequency divides the output of the first counter by a fourth frequency-division factor, which is smaller than the third frequency-division factor. The switching control means converts the output of the third counter into a signal which is synchronized with the output of the first counter and supplies the converted signal to the first counter, as the first control signal. The digital frequency divider is suitable for use in a phase-locked loop frequency synthesizer.

BRIEF DESCRIPTION OF DRAWINGS

Other objects and features of the present invention will be more apparent from the following detailed description, taken in conjunction with the accompanying drawings, wherein.

DETAILED DESCRIPTION OF THE INVENTION

Figure 1:
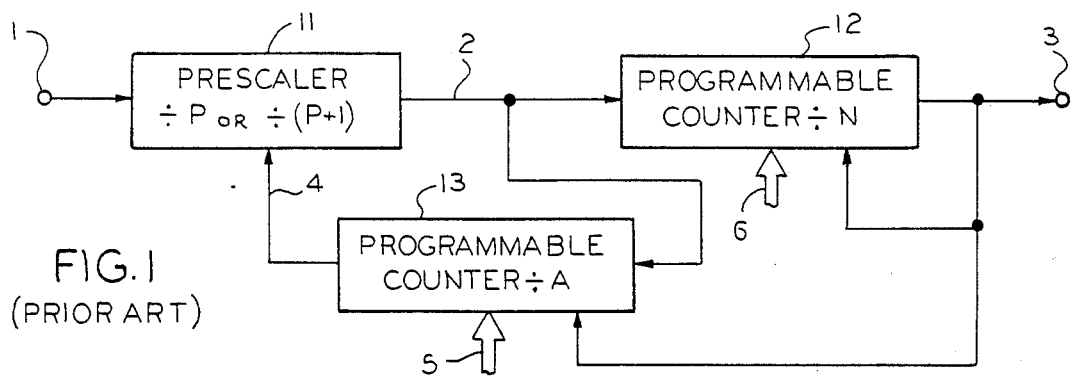
FIG. 1 is a block diagram illustrating a conventional digital frequency divider, sometimes known as a "pulse swallow" frequency divider.

In FIG. 1, a two-modulus prescaler or counter 11 selects two frequency-division factors P and P+1 in response to the high and low levels, respectively, of a control signal applied over conductor 4. Responsive thereto, circuit 11 frequency divides a signal supplied to a terminal 1, by the selected factor. The output of the prescaler 11 appears on conductor 2 from which the signal is frequency divided by the factor N, in a programmable counter 12. During the counting of N pulses in the counter 12, a swallow counter or programmable counter 13 counts the output of the prescaler 11, to a value A. Then, the swallow or programmable counter 13 generates the control signal on conductor 4 for selectively switching the frequency-division factors of the prescaler 11.

The operation of the divider of FIG. 1 will be described below by supposing that the number N is larger than the number A, with the description starting from a state where the frequency-division factor of the prescaler 11 is P+1. The prescaler 11 frequency divides the signal supplied to the input terminal 1 by P+1, and the resulting output is entered into the programmable counters 12 and 13. Since N is greater than A, the counter 13 completes its counting earlier than the counter 12 completes its counting. At this time, the counter 13 raises the voltage level of the switching control signal on conductor 4 from a low to a high level, and switches the frequency-division factor of the prescaler 11 from P+1 to P. After switching the prescaler to P, the counter 13 stops, and the counter 12 counts the remaining number (N-A) of pulses, the counter 12 output pulses then being supplied to an output terminal 3. This output 3 sets the counters 12 and 13 to their predetermined frequency-division factors, and makes them ready to start the next counting cycle. At the same time, the output of the counter 13 (i.e. the switching control signal on conductor 4) is reduced from a high to a low level. The frequency-division factor of the counter 11 returns to P+1, to enable the same operation to be repeated.

The overall frequency-division factor $N_T$ of such a frequency divider is given by the following equation:

$$N_T = (P+1)A + P(N-A) = PN + A \qquad (1)$$

where $$N \geq A \quad (2)$$

The condition of Equation (2) is obvious from the operating principle of this frequency dividing system. When A and N are varied by signals 5 and 6, the overall frequency-division factor $N_T$ is set to be given by any consecutive integers:

$$\left. \begin{array}{l} A = 0 \sim P - 1 \\ N \geq A = P - 1 \end{array} \right\} \quad (3)$$

where A is part of the output count of prescaller 11, as counted by programmable counter 13; and P is remaining part of the output count of prescaller 11, after the programmed count of counter 13 is reached.

In this case, the minimum overall frequency-division factor $N_{Ti}$ means $A_{min}=0$, $N_{min}=P-1$ in Equation (3). This division factor is given as follows:

$$N_{Ti} = PN_{min} + A_{min} = P(P-1) \quad (4)$$

Thus, it is known that the frequency-division ratio $N_T$ can be any of the consecutive integers which are not smaller than $P(P-1)$. However, the foregoing description does not take into account any elementary delay in the individual frequency divider means.

In order for this digital frequency divider to operate normally in an actual high-frequency process, the control signal on conductor 4 of the prescaler 11 must be fed back within a transmission delay time which is equal to one cycle of the output pulse of the prescaler 11. That is, in the circuit illustrated in FIG. 1, assume that the set-up time of the prescaler 11 (when it switches the frequency-division factor in accordance with the control signal on conductor 4) is represented by $t_{ps}$; that the transmission delay time of the programmable counter 13, is $t_A$; and that the cycle of the output of the prescaler 11 is $t_c$. The following relation must be satisfied:

$$t_{ps} + t_A < t_c$$

In this case, the permissible loop delay time $t_c$ can be extended by enlarging the factor P of the prescaler 11. This can be one solution, but it involves a disadvantage since the $N_{Ti}$ given by Equation (4) rises with $P(P-1)$, and causes a narrowing of the applicable range of the frequency divider. Moreover, this solution does not give any clue for reducing the propagation time of the feedback loop.

Therefore, the present invention is intended to provide a higher-speed, digital frequency divider of the pulse swallow type of system. It has a simpler circuitry and is capable of reducing the transmission delay time of its feedback loop.

The invention essentially avails itself of the basic principle of the pulse swallow frequency divider. To reduce the transmission of delay time $t_{ps}+t_A$ of the feedback loop, Equation (1) can hold true irrespective of the output timing of the control signal on conductor 4, as long as the programmable counter 12 is counting N.

Figure 2:
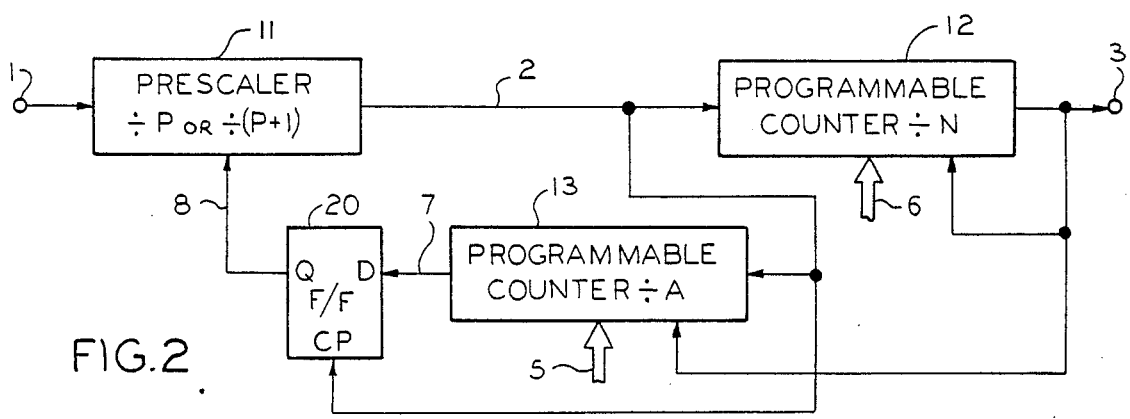
FIG. 2 is a block diagram illustrating a digital frequency divider according to the invention.

FIG. 2 illustrates one embodiment of a pulse swallow type digital frequency divider, according to the invention. A switching control circuit 20 generates a control signal on conductor 8, which signal is supplied to the digital frequency divider of FIG. 1. The switching control circuit 20 is a common D-type flipflop having a data terminal D, a clock terminal CP, and an output terminal Q. Data fed to the data terminal D is read into the flipflop at the leading edge of the input pulse to the clock terminal CP and is output at the output terminal Q. The output on conductor 7 of the counter 13, is supplied to the data terminal D of this flipflop 20. The output on conductor 2 of the counter or prescaler 11 is supplied to the clock terminal CP of flipflop 20. Accordingly, the output signal on conductor 7 of the counter 13 is read into the flipflop 20 at the leading edge of the output pulse of the counter 11, and output at the output terminal Q to serve as the control signal on conductor 8 for the prescaler 11.

Figure 3:
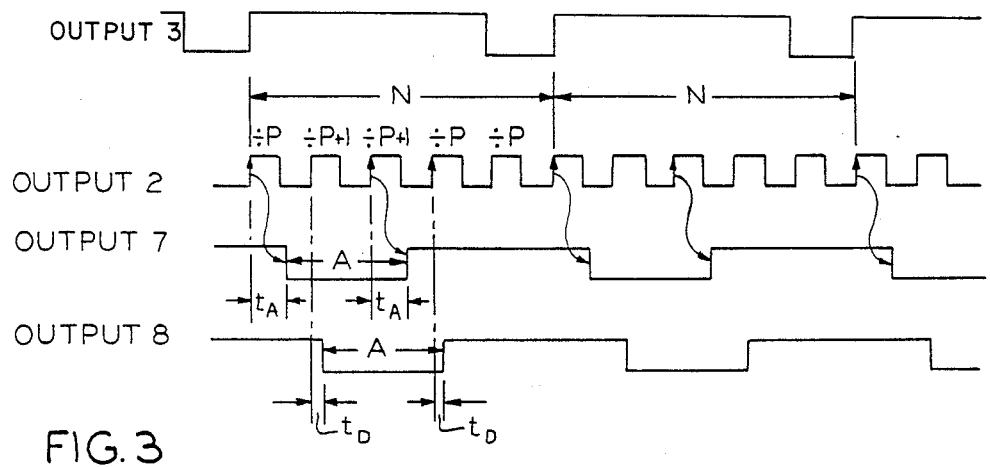
FIG. 3 shows an example of waveforms at various points in FIG. 2.

FIG. 3 is a time chart illustrating the operation of the frequency divider shown in FIG. 2, where N=5 and A=2. The output at terminal 3 of the counter 12 falls from a high to a low level at the leading edge of the N-th output pulse of the prescaler 11. Because of this low level, the programmable counters 12 and 13 are preset at the leading edge of the (N+1)-th output pulse of the prescaler 11. The conductor 7 output of the counter 13 falls to a low level later than the (N+1)-th leading edge, the delay being caused by the transmission delay time $t_A$ of the counter 13. The low level of the output on conductor 7, from the counter 13, is read into the flipflop 20 at the leading edge of the (N+1)-th prescaler 11 output pulse on conductor 2. The output on conductor 8, of the flipflop 20, falls later than the leading edge of the output on conductor 2, the delay being caused by the transmission delay time $t_p$ of the flipflop 20. For simplicity of description, it is assumed that the transmission delay times at the leading and trailing edges are equal to each other. When the counter 13 counts (by 2) the output pulses, as they appear on conductor 2, of the counter 11, the output on conductor 7 of the counter 13 rises to a high level with a delay time $t_A$. The output on conductor 8 of the flipflop 20 also rises to a high level with a delay time $t_D$ lagging behind the leading edge of the (N+1)-th output pulse on conductor 2 of the prescaler 11.

According to the time chart of FIG. 3, the following conditions are required in order for the frequency divider illustrated in FIG. 2 to operate normally:

$$t_A < t_c \quad (6)$$

$$t_{ps} + t_D < t_c \quad (7)$$

To compare these conditions with those of a conventional frequency divider, given by Equation (5), there is an improvement of the time $t_A$ by the time $t_{ps}$, according to Equation (6). Also, the transmission delay time of the feedback loop is reduced by $(t_A - t_D)$, where $t_A > t_D$, according to Equation (7). To discuss the practicability of $t_A > t_D$ in this case, it is easy to make the delay time $t_D$ of the flipflop 20 smaller than the delay time $t_A$ of the counter 13, which is generally composed of a plurality of counter units.

Next will be explained the minimum frequency-division factor $N_{Ti}$ in the frequency divider according to the present invention. As can be readily understood from FIG. 3, the flipflop 20 output on conductor 8, on the whole, lags behind the counter 13 output on conductor 7, by a factor of one clock pulse in the output of the prescaler 11. Thus, it is shifted by one clock pulse toward the right in FIG. 3. Therefore, the condition corresponding to Equation (2) is:

$$N \geq A + 1 \qquad (8)$$

and the conditions corresponding to Equation (3) are given by the following:

$$\left. \begin{array}{l} A = 0 \sim P - 1 \\ N \geq A + 1 = P \end{array} \right\} \qquad (9)$$

Accordingly, the minimum overall frequency-division factor $N_{Ti}$ is given by the following equations since $A_{min} = 0$ and $N_{min} = P$.

$$N_{Ti} = PN_{min} + A_{min} = P^2 \qquad (10)$$

Therefore, according to the present invention, the $N_{Ti}$ in the frequency divider is greater by P, as compared with the $N_{Ti}$ of a conventional frequency divider. In most instances, this much increase causes no practical problems.

Although the FIG. 2 shows only one stage of a D-type flipflop, used as the switching control circuit 20 in the frequency divider, the delay time can be obviously reduced, not only by using other elements with a corresponding function, but also by connecting n stages of such elements in cascade. In this case, general equations corresponding to Equations (8), (9) and (10) are given by the following equations:

$$N > A + n \qquad (11)$$

$$\left. \begin{array}{l} A = 0 \sim P - 1 \\ N \geq A + n = P + n - 1 \end{array} \right\} \qquad (12)$$

$$N_{Ti} = PN_{min} + A_{min} = P(P + n - 1) \qquad (13)$$

Figure 4:
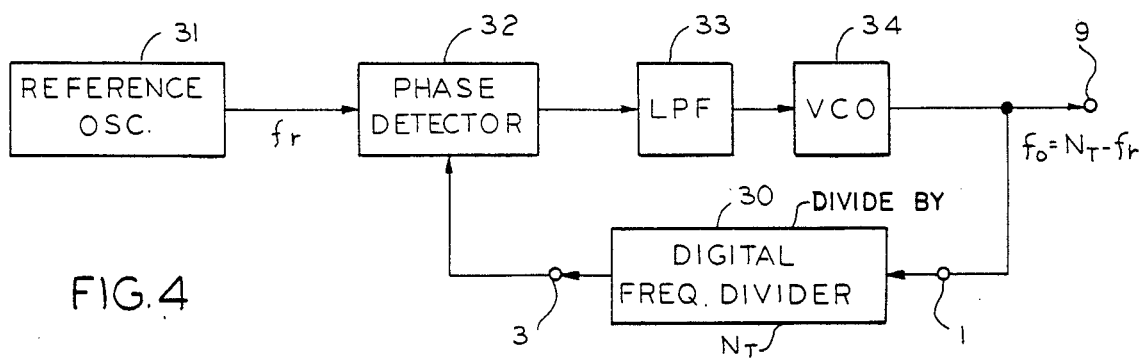
FIG. 4 is a block diagram illustrating an application of the digital frequency divider shown in FIG. 2 to a frequency synthesizer system.

FIG. 4 is a block diagram illustrating the application of the digital frequency shown in FIG. 2 to a frequency synthesizer. In FIG. 4, reference numeral 30 identifies the digital frequency divider of FIG. 2, with the reference numerals 1 and 2 identifying the input and output connections. A reference oscillator 31 generates a reference frequency $f_r$. A phase detector 32 detects the phase difference between the output of the digital frequency divider 30 and the reference oscillator 31. A low-pass filter 33 filters the output of the phase detector 32. A voltage-controlled oscillator (VCO) 34 gives the output frequency $f_o = N_T f_r$, in response to the output signal of the low-pass filter 33. Any output frequency $f_o$ can be obtained at an output terminal 9, by varying the overall frequency-division factor $N_T$ of the digital frequency divider 30 (i.e. by varying the frequency-division factors A and N of the counters 12 and 13, respectively, in FIG. 2, responsive to signals applied to conductors 5 and 6).

As described above, according to the present invention, a higher-speed digital frequency divider is provided by the use of the pulse swallow system, which has a simple circuitry and which reduces the transmission delay time of the feedback loop.

Those who are skilled in the art will readily perceive how to modify the system. Therefore, the appended claims are to be construed to cover all equivalent structures which fall within the true scope and spirit of the invention.

We claim:

1. A digital frequency divider comprising first prescaling counter means for frequency dividing an input signal by selecting either a first or a second frequency-division factor in response to a first control signal, said first counter means having a cycle time $t_c$, second counter means for generating a desired output signal by frequency dividing the output of said first counter means by a third frequency-division factor, third counter means for frequency dividing the output of said first counter means by a fourth frequency-division factor, said third counter means introducing a transmission delay time $t_A$, said fourth frequency-division factor being smaller than said third frequency-division factor, and switching control means for converting the output of said third counter means into a signal which is synchronized with the output of said first prescaling counter means and for returning the converted signal to said first counter means as said first control signal, said switching means introducing a transmission delay time $t_D$, said frequency divider operating so that $t_A < t_c$ and $t_{ps} + t_D < t_c$ where $t_{ps}$ is the set up time required for switching the frequency division factor of the first counter means.

2. The digital frequency divider, as claimed in claim 1, wherein said switching control means comprises a D-type flipflop having an input terminal connected to the output of said third counter means, a clock terminal connected to the output of said first prescaling counter means, and an output terminal connected to a control terminal of said first prescaling counter means for applying said first control signal thereto.

3. A digital frequency divider for use in a phase-locked loop frequency synthesizer, said divider comprising first counter means responsive to a control signal for frequency dividing an input signal by selecting one of two frequency-division factors P and P+1, said first counter means having a cycle time $t_c$, second counter means for providing a desired output signal responsive to the output of said first counter means by frequency dividing said output of said first counter means by means of a frequency-division factor N, third counter means for frequency dividing the output of said first counter means by a frequency-division factor A which is smaller than said factor N, said third counter means introducing a delay time $t_A$, and switching control means for converting the output of said third counter means into a signal which is synchronized with the output of said first counter means and for supplying the converted signal to said first counter means as said control signal, said switching means introducing a transmission delay time $t_D$, said frequency divider operating so that $t_A < t_c$ and $t_{ps} + t_D < t_c$ where $t_{ps}$ is the set up time required for switching the frequency division factor of the first counter means.

4. The digital frequency divider, as claimed in claim 3, wherein said switching control means comprises a D-type flip flop having an input terminal connected to the output of said third counter means, a clock terminal connected to the output of said first counter means, and an output terminal connected to a control terminal of said first counter means for applying said control signal thereto.

5. A digital frequency divider, as claimed in claims 3 or 4, wherein said second and third counter means are programmable counters.

6. A frequency synthesizer including voltage controlled oscillator means for generating a desired output signal in response to a first control signal, frequency divider means for frequency dividing said desired output signal, reference frequency oscillator means, detecting means for detecting the frequency difference between the output of said reference frequency oscillator means and the output of said frequency divider means to provide said first control signal, said frequency divider means comprising a first counter means for frequency dividing said desired output signal by selecting one of first and second frequency-division factors in response to a second control signal, said first counter means having a cycle time $t_c$, second counter means for driving said detecting means by frequency dividing the output of said first counter means by a third frequency-division factor, third counter means for frequency dividing the output of said first counter means by a fourth frequency-division factor which is smaller than said third frequency-division factor, said third counter means introducing a delay time $t_A$, and switching control means for converting the output of said third counter means into said second control signal in synchronization with the output of said first counter means, said swithing means introducing a transmission delay time $t_D$, said frequency divider operating so that $t_A < t_c$ and $t_{ps} + t_D < t_c$ where $t_{ps}$ is the set up time required for switching the frequency division factor of the first counter means.

7. The frequency synthesizer, as claimed in claim 6, wherein said switching control means comprises a D-type flip flop having an input terminal connected to the output of said third counter means, a clock terminal on said flip flop being connected to the output of said first counter means, and an output terminal on said flip flop being connected to a terminal of said first counter means for supplying said second control signal thereto.

8. The frequency synthesizer, as claimed in either claims 6 or 7 wherein each of said second and third counter means is a programmable counter.

9. A controllable digital frequency divider comprising means for receiving a continuous stream of cyclically recurring input pulses, first counting means for giving an output signal at the end of a predetermined time limit following the receipt of any in the stream of input pulses, said output signal being selectively given at the end of either of two adjacent counts of a group of sequential pulses among said continuous stream of incoming pulses, said first counter having a control terminal driven by control pulses applied thereto for setting said first counter to select one of said two adjacent counts, the selection being completed within said first counting means in a given time period which is less than said predetermined time limit, second counter means driven by said output signals from said first counter means to give an output pulse after the receipt of a predetermined number of said output siganls, third counter means also driven by said output signals from said first counter means for selectively generating a selection signal a specific time interval after the receipt of a programmed number of said output signals, said programmed number being fewer than either of said two adjacent counts, and synchronizing delay means driven by said selection signal for generating said control signal within said predetermined time limit following the receipt of the specific pulse within said incoming pulse stream which results in the one of said output signals that causes the third counting means to generate said selection signal, whereby a timed acceptance window for the receipt of said control signal by said first counter is not dependent upon time lags in the circuit including said third counter and said control terminal.

* * * * *